(12) United States Patent  
Sugiyama

(10) Patent No.: US 6,177,684 B1
(45) Date of Patent: Jan. 23, 2001

(54) QUANTUM SEMICONDUCTOR DEVICE HAVING A QUANTUM DOT STRUCTURE

(75) Inventor: Yoshihiro Sugiyama, Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/123,981

(22) Filed: Jul. 29, 1998

(30) Foreign Application Priority Data

Mar. 17, 1998 (JP) .................................................. 10-066899

(51) Int. Cl.[7] .................... H01L 31/0304; H01L 31/036; H01L 33/00
(52) U.S. Cl. ................. 257/17; 257/13; 257/21; 257/97
(58) Field of Search ................. 257/17, 21, 13, 257/97

(56) References Cited

U.S. PATENT DOCUMENTS 5,719,895 * 2/1998 Jewell .
5,959,307 * 9/1999 Nakamura .............................. 257/14

OTHER PUBLICATIONS

Naoi et al, *Solid State Elec.* vol. 41, No 2 pp. 319–321 "MOCVD . . . Applications", 1997.*
Bimberg, D., et al., Jpn. J. Appl. Phys., vol. 35 (1996), pp. 1311–1319.
Fafard, S., et al., Appl. Phys. Lett. 68(7), Feb. 12, 1996, pp. 991–993.
Kondow, M., et al., Jpn. J. Appl. Phys., vol. 35 (1996) pp. 1273–1275.
Kondow, M., et al., IEEE J. Selected Topics in Quantum Electronics, vol. 3, No. 3, Jun. 1997, pp. 719–730.
Leonard, D., et al., Appl. Phys. Lett. 63(23), Dec. 6, 1993, pp. 3203–3205.
Mukai, K., et al., Jpn. J. Appl. Phys., vol. 33 (1994), pp. L1710–L1712, Part 2, No. 12A, Dec. 1, 1994.
Oshinowo, J., et al., Appl. Phys. Lett. 65(11), Sep. 12, 1994, pp. 1421–1423.

* cited by examiner

Primary Examiner—Jerome Jackson, Jr.
(74) Attorney, Agent, or Firm—Armstrong, Westerman, Hattori, McLeland & Naughton

(57) ABSTRACT

A quantum semiconductor device includes a plurality of intermediate layers stacked on each other repeatedly, each being formed of a first semiconductor crystal having a first lattice constant and including a plurality of quantum dots of a second semiconductor crystal having a second lattice constant different from the first lattice constant, the second semiconductor crystal forming thereby a strained system with respect to the first semiconductor crystal, each of the quantum dots in an intermediate layer having a height substantially identical with a thickness of the intermediate layer, each quantum dot in an intermediate layer aligning with another quantum dot in an adjacent intermediate layer in a direction perpendicular to a principal surface of the intermediate layer, each of the intermediate layers having a thickness equal to or smaller than a Bohr-radius of carriers in said intermediate layer, wherein the second semiconductor crystal contains N.

18 Claims, 9 Drawing Sheets

QUANTUM SEMICONDUCTOR DEVICE HAVING A QUANTUM DOT STRUCTURE

BACKGROUND OF THE INVENTION

The present invention generally relates to semiconductor devices and more particularly a quantum semiconductor device including therein a quantum dot structure.

In a so-called bulk crystal where there is no confinement of carriers, it is well known that the density of state of the carriers increases continuously and parabolically with energy. In a quantum well structure in which carriers are confined one-dimensionally in a crystal, there appear discrete quantum levels as is well known in the art. In such a case, the density of state of the carriers changes stepwise. Because of such a restriction imposed on the distribution of the carriers, a quantum well structure provides a narrow spectrum when used for an optical semiconductor device such as a laser diode, and the efficiency of laser oscillation is improved. Further, a quantum well structure is used in electron devices having a resonant tunneling barrier such as an RHET (Resonant Hot Electron Transistor) as an energy filter of carriers.

In a quantum well wire structure in which the degree of confinement of the carriers is increased further, the density of state of the carriers in the crystal is modified such that the density of state is a maximum at the bottom edge of each step. Thereby, the sharpness of the spectrum is increased further.

In an ultimate quantum dot structure in which the degree of carrier confinement is increased further, the density of state becomes discrete in correspondence to the discrete quantum levels. A system having such a discrete energy spectrum, in which transition of carriers occurs only discontinuously or stepwise, provides a very sharp spectrum when used for an optical semiconductor device even in a room temperature environment where the carriers experience substantial thermal excitation.

Further, the quantum dot structure is drawing the attention of scientists in relation to the problems of fundamental physics such as a phonon bottleneck problem of energy relaxation.

Conventionally, a quantum well structure has been formed readily and with reliability by using an MBE (Molecular Beam Epitaxy) process or an MOCVD (Metal Organic Chemical Vapor Deposition) process such that a very thin quantum well layer is sandwiched between a pair of barrier layers. On the other hand, a quantum well wire has been formed by growing thin semiconductor layers laterally on a so-called inclined semiconductor substrate having a stepped surface structure. Alternately, a quantum well wire may be formed by applying an electron beam lithography to an ordinary, one-dimensional quantum well structure.

Thus, various attempts have been made to form quantum dots by using an inclined substrate similarly to the case of forming a quantum well wire. However, such conventional attempts have faced a problem of controlling the stepped surface of the inclined substrate. Further, there tends to occur a mixing of elements at the boundary of the quantum dots formed in such a manner. Thereby, a desired sharp transition of the composition is difficult in the quantum dots formed as such. Thus, there are few successful attempts in the approach that use an inclined substrate in combination with lateral epitaxial growth process of semiconductor layers. In addition, an approach to use electron-beam lithography to form a quantum dot is also unsuccessful due to the damage caused in the epitaxial layers forming the quantum dot or a barrier layer at the time of patterning.

On the other hand, there has been a discovery that a quantum dot can be formed easily by using a so-called S-K (Stranski-Krastanow) mode growth that occurs in a strained heteroepitaxial system such as an InAs/GaAs heteroepitaxial structure at the initial period of the heteroepitaxial growth. In an S-K mode growth, quantum dots are formed in the form of discrete islands on a substrate. For example, it is reported that an MBE growth of an InGaAs layer having an In-content of 0.5 on a GaAs substrate with a thickness of several molecular layers, results in a formation of islands of InGaAs each having a diameter of 30–40 nm on the GaAs substrate (Leonard, D., et al., Appl. Phys. Lett. 63, pp.3203–3205, 1993). Further, it is reported that islands of InGaAs having a diameter of 15–20 nm are formed on a GaAs substrate by an ALE (Atomic Layer Epitaxy) process with a mutual distance of about 100 nm (Mukai, K., et al., Jpn. J. Appl. Phys., 33, pp.L1710–L1712, 1994). Further, a similar quantum dot can be formed also by a MOVPE process (Oshinowo, J. et al., Appl. Phys. Lett. 65,(11), pp.1421–1423, 1994).

As the formation of a quantum dot in such a strained heteroepitaxial system is controlled by a strain energy formed at the heteroepitaxial interface, the formation of the quantum dot is substantially simplified as compared with the conventional process discussed previously. Further, the formation of a quantum dot on a strained heteroepitaxial system does not require a patterning process and is inherently free from damages. There is already a report claiming successful observation of a photoluminescence (PL) (Leonard, D., et al., op. cit.), in which it is reported that a broad PL peak is confirmed in the vicinity of 1.2 eV with a substantial intensity.

In the quantum dots formed by the S-K mode growth, however, the observed PL peak, although having a substantial intensity, spreads or diffuses substantially. For example, the half-height width FWHM (Full Width at Half Maximum) of the PL peak spreads over a range of 80–100 meV, probably due to the poor control of the size of the individual quantum dots. It should be noted that the PL wavelength corresponding to the foregoing PL peak energy is about 1.1 $\mu$m, which is shifted substantially on a shorter wavelength side with respect to the wavelength of 1.3 pm that is used commonly in the field of optical telecommunication and optical information processing. With the conventional S-K mode quantum dots, it has been difficult to tune the PL wavelength as necessary. As will be described later, the size of the quantum dot itself can be controlled to some degree by controlling the deposition temperature. However, the size of the quantum dots formed in such a manner changes variously. It is believed that it is such a variation of the size of the quantum dots that causes the foregoing unwanted spreading of the PL peak. Further, it is believed that conventional quantum dot structure thus formed by the S-K mode growth includes a substantial number of quantum dots that do not contribute to the photon emission.

Recently, Farad et al., (Farad. S., Appl. Phys. Lett., 68(7), pp.991–993, Feb. 12, 1996) has reported a successful observation of a PL wavelength in the 1.5 $\mu$m-band for an S-K mode quantum dot of InAs formed on an AlInAs buffer layer, which in turn is provided on an InP substrate with a lattice matching therewith. In this case, however, the value of FWHM for the observed PL spectrum exceeds 110 meV, indicating that there still remains a substantial problem in the size control of the individual quantum dots.

Thus, conventional S-K mode quantum dots have failed to provide a sharp spectrum of photon emission in the wavelength band of 1.3 $\mu$m or 1.5 $\mu$m, which is important for industrial applications. Further, a similar problem occurs also in electron devices such as an RHET. An energy filter formed by conventional S-K mode quantum dots performs poorly when the S-K mode quantum dots are used in a resonant-tunneling barrier of an RHET. In such a case, the desired sharp tunneling effect is not obtained.

Meanwhile, the inventor of the present invention discovered a phenomenon, in a S-K mode growth of quantum dots, in that quantum dots grown on an intermediate layer covering quantum dots of a lower layer, align with the corresponding quantum dots of the lower layer (Sugiyama, Y., et al., Jpn. J. Appl. Phys. 35, Part I, No.2B, pp.365–369, February, 1996). Based on the discovery, the inventor of the present invention has proposed, in the U.S. patent application Ser. No. 08/753,598, which is incorporated herein as reference, a quantum semiconductor device comprising, a semiconductor substrate, an active layer formed on the semiconductor substrate and including a quantum structure, the quantum structure comprising a plurality of intermediate layers stacked on each other repeatedly, each of the plurality of intermediate layers being formed of a first semiconductor crystal having a first lattice constant; each of the intermediate layers including a plurality of quantum dots of a second semiconductor crystal having a second lattice constant different from the first lattice constant, the second semiconductor crystal forming thereby a strained system with respect to the first semiconductor crystal, each of the quantum dots in an intermediate layer having a height substantially identical with a thickness of the intermediate layer; a quantum dot in an intermediate layer aligning with another quantum dot in an adjacent intermediate layer in a direction perpendicular to a principal surface of the semiconductor substrate; each of the plurality of intermediate layers having a thickness equal to or smaller than a Bohr-radius of carriers in the intermediate layer.

It is believed that the foregoing alignment of the quantum dots is caused as a result of accumulation of the strain in the intermediate layer in correspondence to the quantum dots covered by the intermediate layer. More specifically, the atoms constituting the semiconductor quantum dots are deposited preferentially on the part of the intermediate layer where the accumulation of the strain is caused. The quantum dots thus aligned perpendicularly to the substrate develop a quantum mechanical coupling with each other to form an effectively single quantum dot having an effectively uniform size.

FIG. 1 shows a quantum structure 3 that includes the vertically aligned S-K mode quantum dots schematically.

Referring to FIG. 1, the quantum structure 3 is formed on a buffer layer 2 of GaAs that in turn is formed on a (100)-oriented surface of a GaAs substrate 1. The buffer layer 2 is formed with a thickness of 400 nm, and a plurality of GaAs intermediate layers 3a are stacked repeatedly on the foregoing buffer layer 2. Each of the intermediate layers 3a carries therein a plurality of quantum dots (islands) 3b of InAs, wherein each of the quantum dots 3b are isolated from other quantum dots 3b in each of the intermediate layers 3a.

It should be noted that InAs has a lattice constant different from that of GaAs forming the buffer layer 2 by about 7%. In other words, the quantum dots 3b form a strained heteroepitaxial system with respect to the buffer layer 2 and hence the substrate 1. In such a strained heteroepitaxial system, there appears a S-K mode growth at the initial period of epitaxial growth when forming an InAs layer, wherein such an S-K mode growth leads to the formation of the island structure of InAs on the surface of the GaAs buffer layer 2.

In the illustrated structure, it should be noted that the GaAs intermediate layer 3a buries the islands 3b of InAs, and the deposition of the intermediate layer 3a and the island 3b is repeated. Each of the islands 3a typically has a diameter of about 20 nm and a height of about 5 nm and forms a quantum dot that confines carriers therein three-dimensionally in combination with the intermediate layer 3a having a larger bandgap and thus acting as a barrier layer.

The inventor of the present invention has discovered previously that the quantum dots 3b align generally perpendicularly to the principal surface of the substrate 1 when the intermediate layer 3a and the quantum dots 3b are deposited repeatedly and alternately as indicated in FIG. 1 (Sugiyama, Y., et al., op. cit.). As explained already, this phenomenon of vertical alignment of the quantum dots 3b is explained by the accumulation of strain in the part of the intermediate layer 3a that covers the underlying quantum dots 3b. The strain is induced by the difference in the lattice constant between the intermediate layer 3a and the quantum dot 3b, wherein the strain thus induced in turn induces an island growth of InAs on the intermediate layer 3a in correspondence to the part where the strain is accumulated.

FIGS. 2A and 2B show a photoluminescence (PL) spectrum obtained for the quantum structure of FIG. 1 at 77 K, wherein the PL spectrum of FIG. 2A is obtained for the quantum structure in which there is only one layer of the quantum dots 3b of InAs, while FIG. 2B shows the PL spectrum of the quantum structure also at 77 K in which the quantum dots 3b of InAs are stacked to form five layers.

Referring to FIG. 2A, it can be seen that the PL spectrum of the quantum structure is low and diffused, indicating that there is a substantial variation in the size of the individual quantum dots 3b. Further, it is noted that the central PL wavelength is shorter than 1.1 $\mu$m, indicating that the quantum structure cannot be used for optical telecommunication or optical information processing that uses a wavelength of 1.3 $\mu$m or 1.5 $\mu$m.

On the other hand, the structure in which the quantum dots 3b are stacked in five layers provides a very sharp PL spectrum as indicated in FIG. 2B. Further, FIG. 2B clearly indicates that the central wavelength is shifted in the shorter wavelength side as compared with the spectrum of FIG. 2A. The result of FIG. 2B supports the interpretation noted before that the stacked quantum dots develop a quantum mechanical coupling to form an effectively single, large quantum dot.

On the other hand, the result of FIG. 2B indicates that the maximum wavelength that can be reached according to such a stacking of the quantum dots is limited to about 1.2 $\mu$m. A further increase of the PL wavelength requires a further increase in the number of stacked layers of the quantum dots, while such an arbitrary increase of the stacking of the quantum dots is difficult to achieve.

SUMMARY OF THE INVENTION

Accordingly, it is a general object of the present invention to provide a novel and useful quantum semiconductor device wherein the foregoing problems are eliminated.

Another and more specific object of the present invention is to provide a quantum semiconductor device including therein self-organized quantum dots as an active part and is operable in the relatively long wavelength range of 1.3 $\mu$m or more.

Another object of the present invention is to provide a quantum semiconductor device, comprising:

a semiconductor substrate;

an active layer formed on said semiconductor substrate and including a quantum structure, said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

said quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer, wherein said second semiconductor crystal contains N.

Another object of the present invention is to provide a quantum semiconductor device, comprising:

a semiconductor substrate;

an active layer formed on said semiconductor substrate and including a quantum structure, said quantum structure comprising:

an intermediate layer formed of a first semiconductor crystal having a first lattice constant;

said intermediate layer including a plurality of quantum dots of a second semiconductor crystal having a second lattice constant different from said first lattice constant, said second semiconductor crystal forming thereby a strained system with respect to said first semiconductor crystal, each of said quantum dots having a height substantially identical with a thickness of said intermediate layer;

said intermediate layer having a thickness equal to or smaller than a Bohr-radius of carriers in said intermediate layer, wherein said second semiconductor crystal contains N.

Another object of the present invention is to provide an optical semiconductor device, comprising:

a semiconductor substrate;

a first cladding layer provided on said semiconductor substrate;

an active layer provided on said first cladding layer and including a quantum structure;

a second cladding layer provided on said active layer;

a first electrode provided on said semiconductor substrate for injecting carriers of a first type into said active layer via said first cladding layer;

a second electrode provided on said second cladding layer for injecting carriers of a second type into said active layer via said second cladding layer;

said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

a quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer, wherein said second semiconductor crystal contains N.

Another object of the present invention is to provide an optical semiconductor device, comprising:

a semiconductor substrate;

a first cladding layer provided on said semiconductor substrate;

an active layer provided on said first cladding layer and including a quantum structure;

a second cladding layer provided on said active layer;

a first electrode provided on said semiconductor substrate for injecting carriers of a first type into said active layer via said first cladding layer;

a second electrode provided on said second cladding layer for injecting carriers of a second type into said active layer via said second cladding layer;

said quantum structure comprising:

an intermediate layer formed of a first semiconductor crystal having a first lattice constant;

said intermediate layer including a plurality of quantum dots of a second semiconductor crystal having a second lattice constant different from said first lattice constant, said second semiconductor crystal forming thereby a strained system with respect to said first semiconductor crystal, each of said quantum dots having a height substantially identical with a thickness of said intermediate layer;

said intermediate layer having a thickness equal to or smaller than a Bohr-radius of carriers in said intermediate layer, wherein said second semiconductor crystal contains N.

According to the present invention, it is possible to construct a quantum semiconductor device or optical semiconductor device that includes therein an InAs/GaAs strained system and associated self-organized quantum dots and is operable at a wavelength band of 1.3 $\mu$m, by incorporating a small amount of N into the InAs quantum dots.

Other objects and further features of the present invention will become apparent from the following detailed description when read in conjunction with the attached drawings.

DETAILED DESCRIPTION OF THE PREFERRED EMBODIMENTS

[PRINCIPLE]

Figure 3:
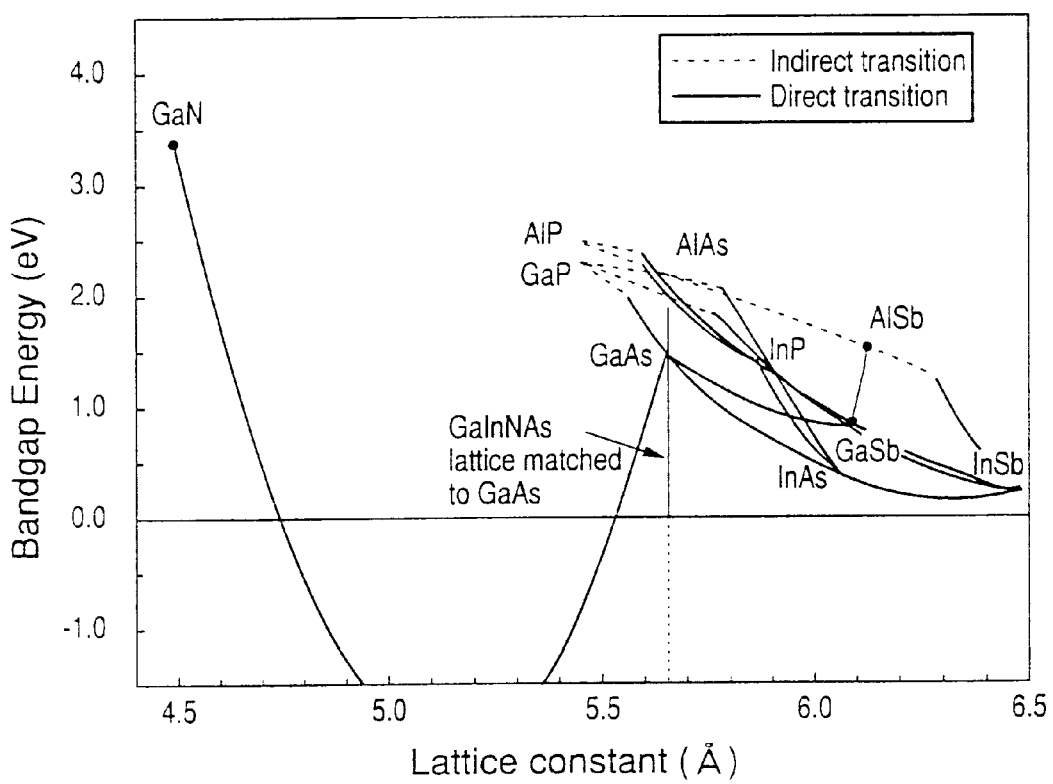
FIG. 3 is a diagram showing the relationship between bandgap and lattice constant of a III-V compound semiconductor system including N.

FIG. 3 shows the relationship between bandgap energy and lattice constant of a III-V compound semiconductor system including GaInNAs according to Kondow, M., et al., IEEE J. SELECTED TOPICS IN QUANTUM ELECTRONICS, VOL.3, NO.3, JUNE 1997.

Referring to FIG. 3, it can be seen that the lattice constant of GaAs decreases from the nominal value of 5.654 Å of pure GaAs when a small amount of As is substituted by N. Associated with such a substitution of As by N, it can also be seen that the bandgap energy is decreased due to the negative bowing, which is characteristic to the system of GaAs-GaN.

Similarly, the bandgap energy Eg of the InAs-InN system is represented according to the relationship $$Eg(x)=0.36+1.53x+4.2x(1-x)$$

where x is the compositional parameter of a crystal in the InAs-InN system represented as $InN_xAs_{1-x}$. In the InAs-InN system, it should be noted that, while the crystal of InN itself belongs to the hexagonal system and has a wurtzite structure contrary to the crystal of InAs which belongs to the cubic system and has a zinc-blende structure, the crystal of the InAs-InN system maintains the zinc-blende structure as long as the content of N or the value of the parameter x is small.

Thus, in order to reduce the PL energy of the foregoing InAs crystal to 0.95 eV corresponding to the wavelength of 1.3 μm, it is sufficient to reduce the bandgap energy Eg by 0.114 eV, by merely incorporating a small amount of N such that the compositional parameter x has a value of 0.0449. At the room temperature, this value of the parameter is reduced further to about 0.03, in view of the tendency of the bandgap energy Eg which decreases at the room temperature than at 77 K.

In the conventional investigation of the compound semiconductor material containing N such as GaNAs or GaInNAs, the composition of the semiconductor material has been controlled so as to achieve a lattice matching with the GaAs substrate. See Kondow, M. et al., op. cit. In the case of the quantum semiconductor device of the present invention in which quantum dots are formed as a result of the S-K mode growth, it should be noted that the existence of an appropriate lattice misfit between the quantum dot and the substrate is essential, contrary to these conventional investigations. On the other hand, FIG. 3 indicates that the lattice constant tends to decrease in the III-V compound semiconductor material such as GaAs or InAs when As is replaced by N. This means that the lattice misfit essential for the quantum semiconductor device of the present invention may be reduced as a result of the incorporation of N into the quantum dots. As long as the compositional parameter x is in the range of 0.03–0.04, a lattice misfit necessary for an S-K mode growth is successfully maintained.

FIGS. 4A and 4B and FIGS. 5A and 5B show the principle of the present invention, wherein those parts corresponding to the parts described previously are designated by the same reference numerals and the description thereof will be omitted.

Figure 4A:
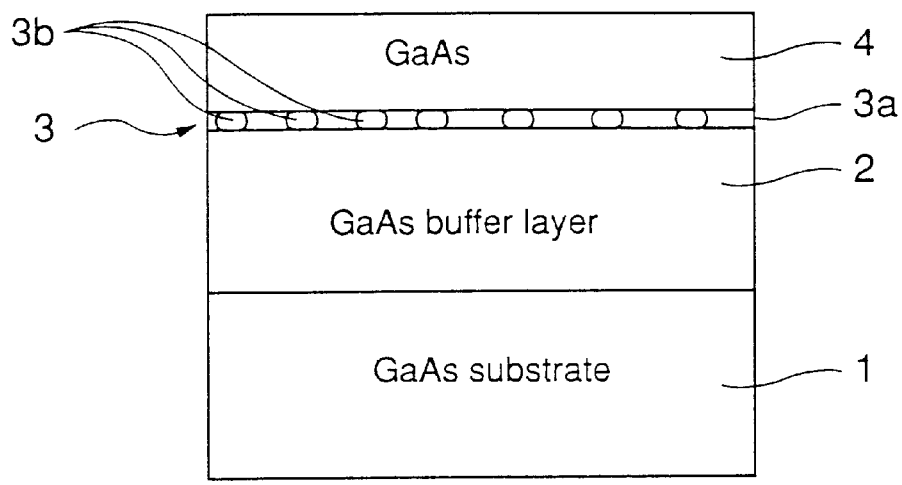
FIGS. 4A and 4B are diagrams showing the principle of the present invention.

Referring to FIG. 4A, the quantum dots 3b are formed on the buffer layer 2 in the form of a single layer, and the quantum dots 3b are covered by a single layer of the GaAs intermediate layer 3a to form the quantum structure 3. The quantum structure 3 is covered by a cap layer 4 of GaAs.

In the structure of FIG. 4A, the quantum dots 3b are formed of InNAs containing about 4% of N. By using InNAs for the quantum dots 3b, the bandgap energy Eg is reduced according to the foregoing equation, resulting in an increase of the wavelength of the optical beam that interacts with the quantum dots 3b.

Figure 4B:
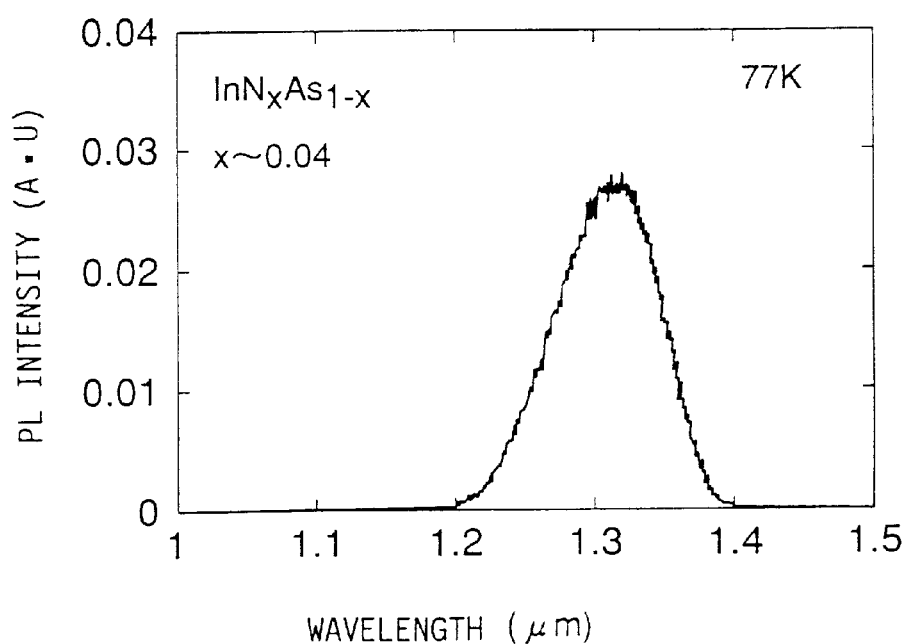

FIG. 4B shows the PL spectrum of the quantum semiconductor device of FIG. 4A at 77 K.

Referring to FIG. 4B, it can be seen that the PL spectrum peak shifts in the longer wavelength direction and takes a value about 1.3 μm as a result of the incorporation of N into the quantum dots 3b with an atomic ratio of about 4%.

Figure 5A:
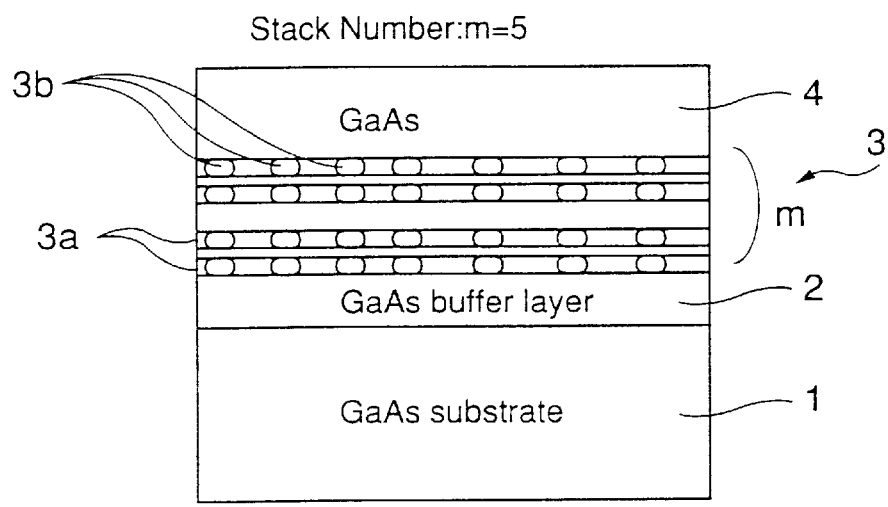
FIGS. 5A and 5B are further diagrams showing the principle of the present invention.

In the structure of FIG. 5A, on the other hand, the intermediate layers 3a, each containing therein the quantum dots 3b of InNAs, are stacked m times. Thereby, the thickness d of each intermediate layer 3a is set smaller than the height of the quantum dots 3b in the as-grown state in which the quantum dots 3b are grown freely. By doing so, the quantum dots 3b are aligned generally perpendicularly to the principal surface of the substrate 1 in the structure of FIG. 5A.

Figure 5B:
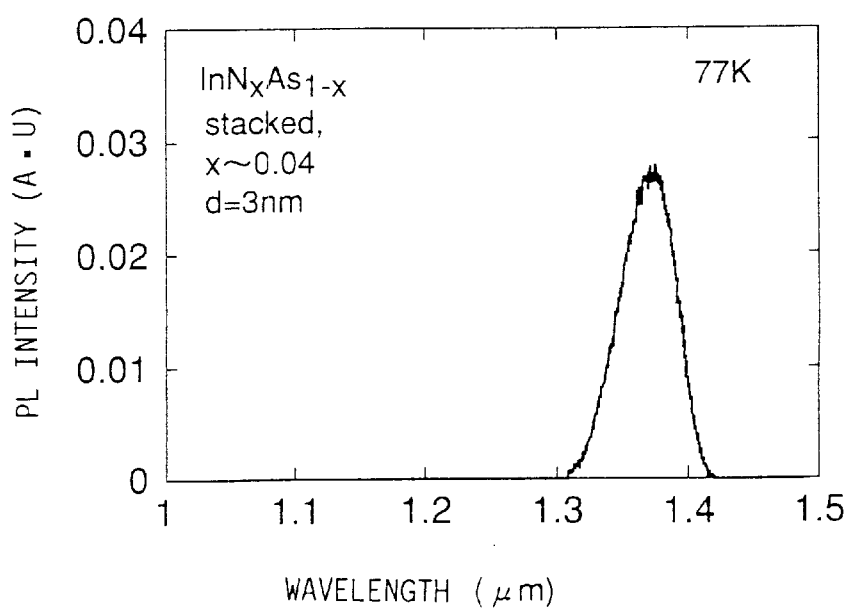

In the structure of FIG. 5A, too, the PL wavelength is increased to about 1.37 μm at 77 K, by incorporating N into the quantum dots 3b with an amount of about atomic 4%. See the PL spectrum of FIG. 5B, wherein FIG. 5B shows the case in which the thickness d of the intermediate layer 3a is set to about 3 xnm.

It is known that the quality of a III-V compound semiconductor crystal is deteriorated substantially when N is incorporated thereinto with an amount of about 4 atomic %. On the other hand, the result of FIG. 5B clearly indicates that the amount of N necessary for achieving the desired tuning of the optical wavelength to 1.3 μm can be achieved with the incorporation of N with an amount much smaller than 4%, provided that the stacked structure of FIG. 5A is used for the quantum structure 3. Thus, the problem of deterioration of the efficiency of optical emission caused as a result of the deterioration of the crystal quality of the N-containing quantum dots 3b, is successfully avoided by employing the stacked quantum structure 3 of FIG. 5A. For example, an optical emission at the wavelength of 1.3 μm is successfully achieved in the quantum structure 3 of FIG. 5A in which the quantum dots 3b are stacked five times, by incorporating N with an amount of 2–3 atomic %, preferably with an amount of about 2.5%.

[FIRST EMBODIMENT]

Figure 6:
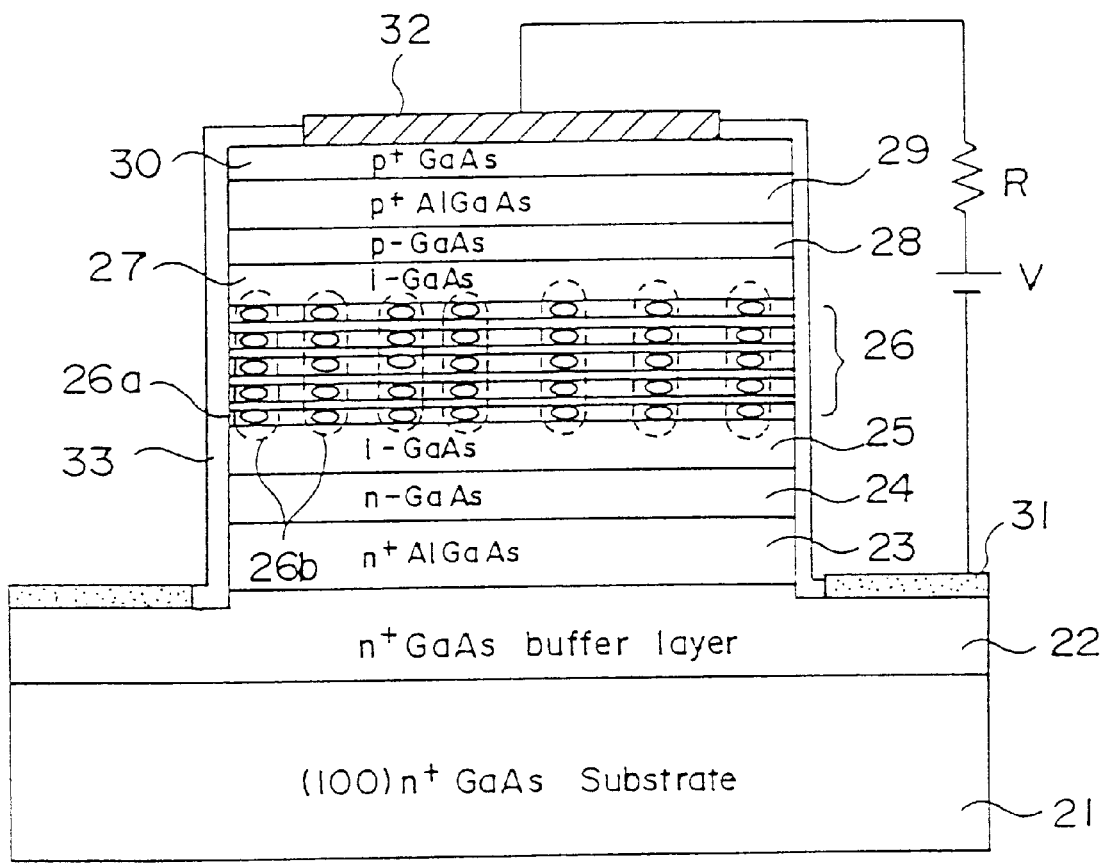
FIG. 6 is a diagram showing the construction of a light emitting diode according to a first embodiment of the present invention.

FIG. 6 shows the construction of a light-emitting diode 20 according to a first embodiment of the present invention.

Referring to FIG. 6, the light-emitting diode 20 is formed on a (100)-oriented surface of a substrate 21 of $n^+$-type GaAs, wherein a buffer layer 22 of $n^+$-type GaAs covers the foregoing (100)-oriented surface of the substrate 21 epitaxially with a thickness of 400–500 nm.

On the buffer layer 22, a lower cladding layer 23 of $n^+$-type AlGaAs is formed epitaxially with a thickness of typically about 300 nm, and a waveguide layer 24 of n-type GaAs is provided on the cladding layer 23 also epitaxially with a thickness of typically 100 nm. Further, an undoped layer 25 of GaAs is provided on the waveguide layer 24 epitaxially with a thickness of about 20 nm as a part of the quantum well structure.

The layers 22–25 are formed for example by an MBE process by setting the substrate temperature to 620° C., while maintaining the pressure inside a reaction chamber in which the deposition is made by setting the As pressure at $6 \times 10^{-6}$ Torr for preventing the dissociation of As.

After the layer 25 is formed in such a manner, the supply of the Ga source is interrupted, and the substrate temperature is lowered to 510° C. After the substrate temperature has reached 510° C., molecular beams of In and As are introduced into the reaction chamber together with an $N_2$ plasma, and a growth of an undoped InNAs layer is made epitaxially on the foregoing GaAs layer 25 with a thickness corresponding to 1.8 molecular layers of InNAs. After the deposition of InNAs, an annealing process is applied for about 30 seconds, and first layer islands 26b of InNAs are formed on the layer 25 with a height of about 5 nm and a diameter of about 20 nm. About the deposition of an InNAs layer, a reference should also be made on Kondow, M., et al., IEEE J. Selected Topics in Quantum Electronics, vol.3, no.3, June 1997, pp.719–730.

After the first InNAs islands 26b are formed in such a manner, a first intermediate layer 26a of undoped GaAs is deposited epitaxially with a thickness of 2–3 nm, such that the first intermediate 26a buries the InNAs islands 26b underneath. Thereby, the InNAs islands 26b form quantum dots dispersed in the first intermediate layer 26a. During the deposition of the first intermediate layer 26a, the InNAs islands 26b undergo a deformation from the as-grown state, and the quantum dots 26b have a decreased height of 2–3 nm corresponding to the thickness of the first intermediate layer 26b.

Figure 1:
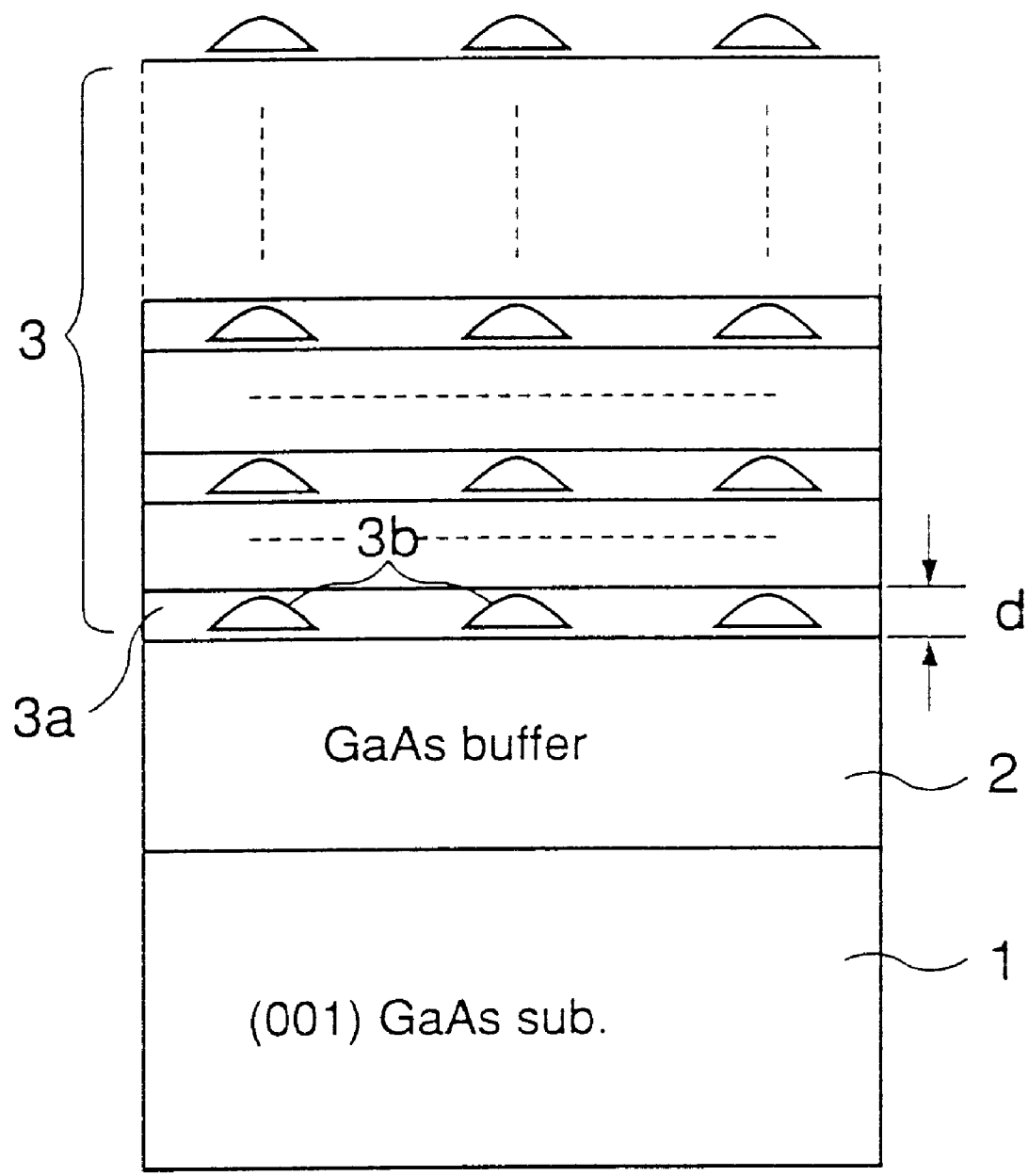
FIG. 1 is a diagram showing the construction of a conventional quantum semiconductor device.
Figure 2A:
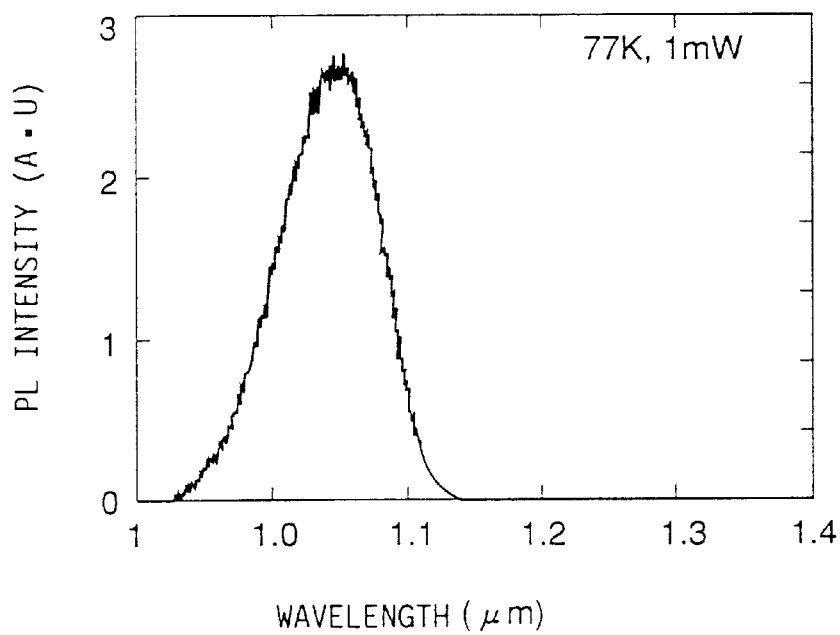
FIGS. 2A and 2B are diagrams showing a PL spectrum of the quantum semiconductor device of FIG. 1.
Figure 2B:
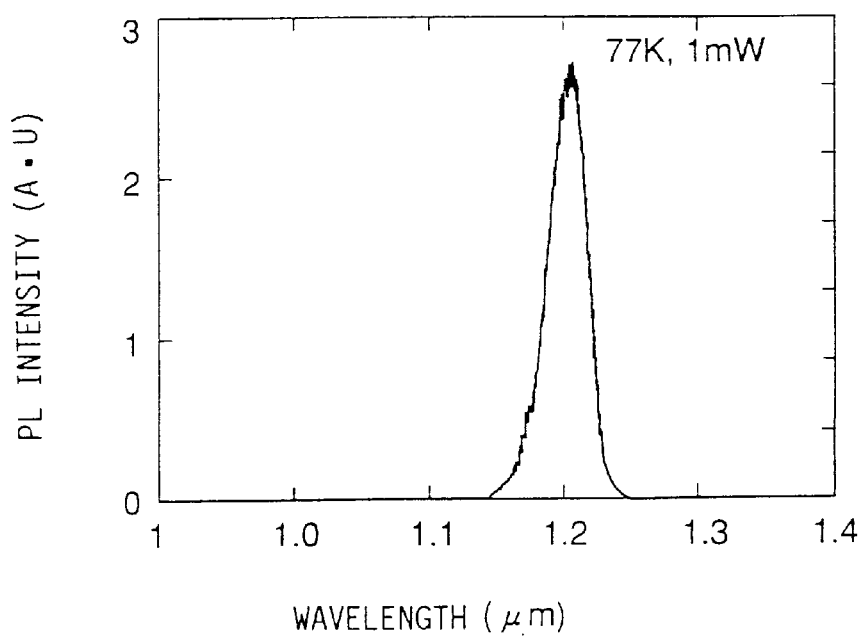

The foregoing formation of the InNAs islands 26b and the deposition of the intermediate layer 26a are repeated four times, and a quantum well structure 26 is obtained, in which the quantum dots 26b align vertically, similarly to the structure of FIG. 1. As a result of such a repetitive deposition, the quantum semiconductor structure has an overall thickness of about 20 nm. The quantum well structure 26 thus formed forms the active layer of the light-emitting diode.

It should be noted that, in such a structure in which the thickness of the intermediate layer 26a is smaller than the height of the InNAs islands 26b in the as-grown or freely grown state, there is a possibility that a quantum dot 26b contacts directly with an adjacent quantum dot 26b in the upper or lower layers. Even in such a case, the upper and lower quantum dots 26b do not merge with each other, and the layered structure of the quantum structure 26 is maintained. Further, there may be one or several atomic layers of GaAs intervening between the vertically aligned quantum dots 26b.

In the light-emitting diode, another undoped GaAs layer 27 is formed epitaxially on the foregoing quantum well structure 26, and an upper waveguide layer 28 of p-type GaAs and an upper cladding layer 29 of p+-type AlGaAs are formed consecutively thereon with respective thicknesses of 120 nm and 300 nm. Further, a cap layer 30 of p+-type GaAs is formed on the layer 29 with a thickness of 50 nm. The deposition of the layers 27–30 may be made according to an MBE process.

The layered semiconductor structure thus formed is then subjected to a mesa etching process until the buffer layer 22 of GaAs is exposed, and a protective film 33 of SiN or the like is provided on the mesa structure thus formed. Further, an electrode 31 is formed on the buffer layer 22 and another electrode 32 is formed in the cap layer 30.

In the light-emitting diode 20 of such a construction, the quantum dots 26b are aligned generally perpendicularly to the principal surface of the substrate with a mutual quantum mechanical coupling, and a very sharp spectrum of optical emission is obtained at the wavelength of 1.37 μm when operated at the temperature of 77 K, provided that N is incorporated into the quantum dots 26b with an amount such that the quantum dots 26b has a composition of $InN_{0.04}As_{0.96}$. When the compositional parameter x of N is set to 0.024, on the other hand, the optical emission is achieved at the wavelength of 1.3 μm at the temperature of 77 K.

In the construction of FIG. 6, it is also possible to form the quantum dots 26b such that the quantum dots 26b form a single layer as indicated in FIG. 4A. In such a case, the optical emission of the 1.3 μm band is achieved at 77 K by setting the compositional parameter x to be 0.04. When the quantum semiconductor is to be operated at the 1.3 μm band at the room temperature, the amount of N to be incorporated into the quantum dot 26b is reduced to about 0.03.

[SECOND EMBODIMENT]

Figure 7:
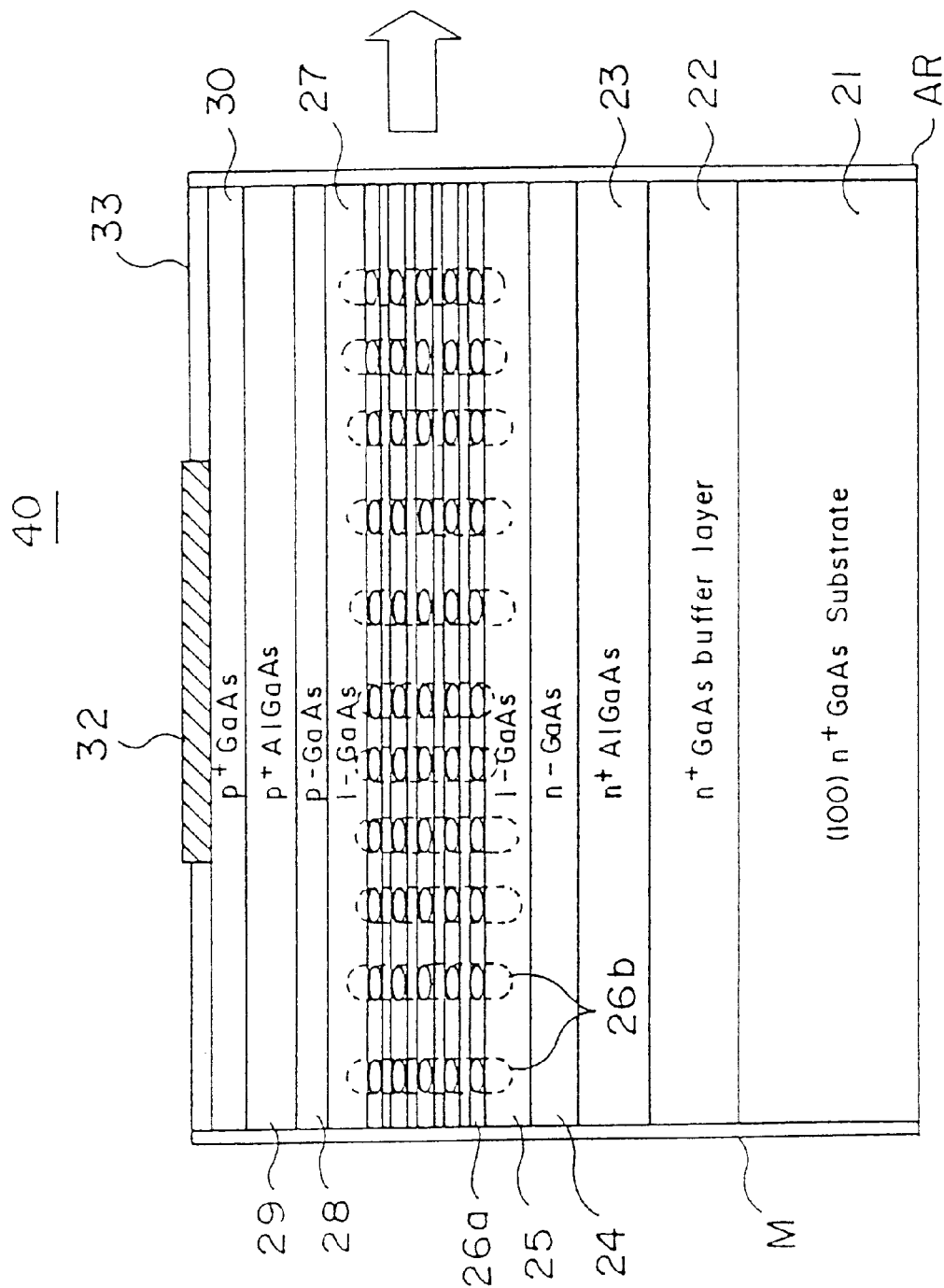
FIG. 7 is a diagram showing the construction of an edge-emission type laser diode according to a second embodiment of the present invention.

FIG. 7 shows the cross-sectional diagram of an edge-emission type laser diode 40 according to a second embodiment of the present invention, wherein those parts described previously are designated by the same reference numerals and the description thereof will be omitted. Further, an illustration of the transversal cross section of the device of FIG. 7 will be omitted, as the laser diode 40 has a transversal cross section substantially identical to that of the light-emitting diode of FIG. 6.

Referring to FIG. 7, a mirror M and a semi-transparent mirror AR are provided respectively on mutually opposing edge surfaces of the laser diode 40. Thereby, the mirror M and the semi-transparent mirror AR form an optical cavity as usual in a laser diode, and the optical beam produced by the vertically aligned quantum dots 26b is amplified by stimulated emission as it is reflected back and forth between the mirror M and the semi-transparent mirror AR. The optical beam thus amplified is emitted from the edge where the semi-transparent mirror AR is provided.

Further, it is possible to provide a diffraction grating between the cladding layer 23 and the waveguide layer 24 in place of providing the mirror M and the semi-transparent mirror AR. In this case, the laser diode 40 forms a so called DFB (Distributed Feedback) laser diode.

[THIRD EMBODIMENT]

Figure 8:
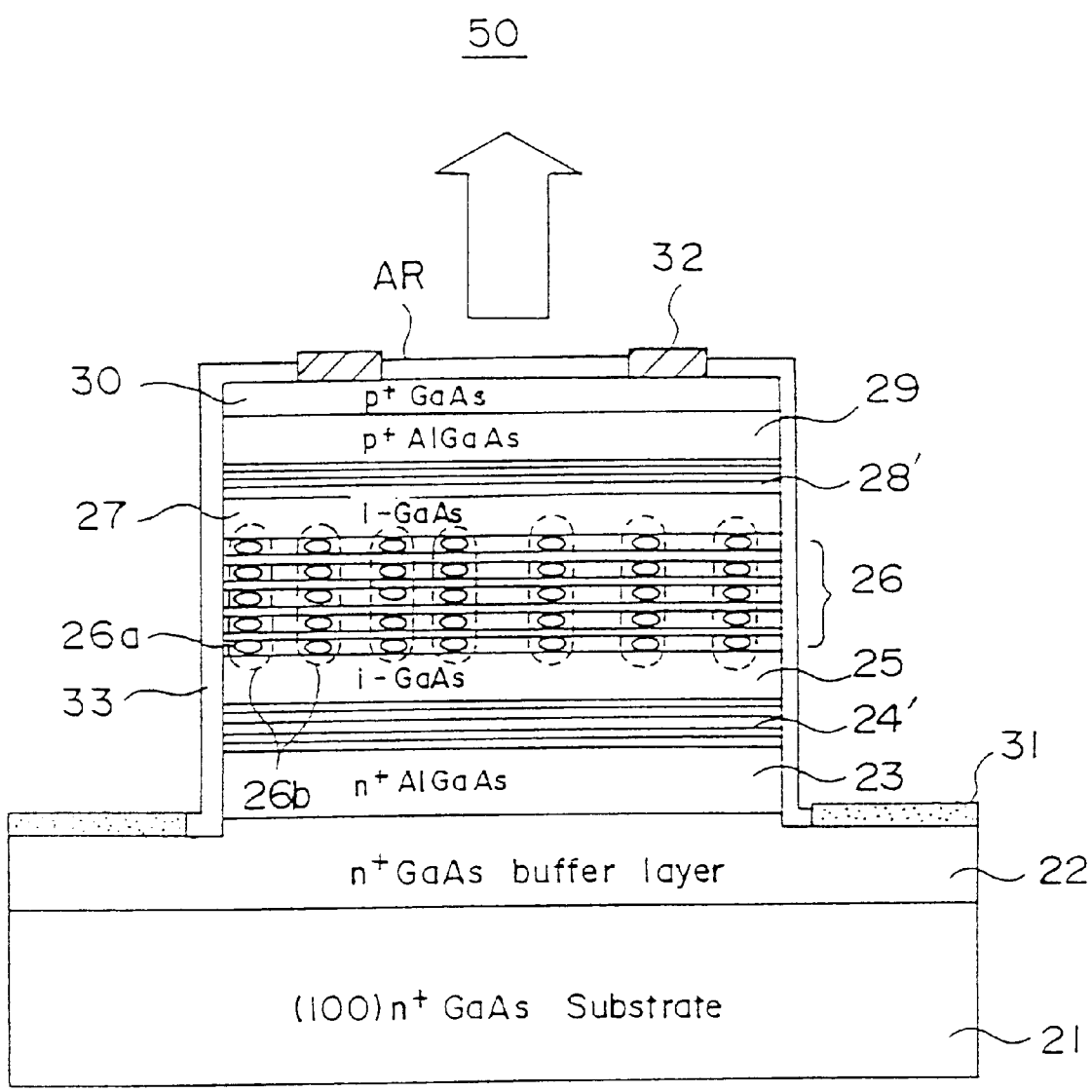
FIG. 8 is a diagram showing the construction of a planar-emission type laser diode according to a third embodiment of the present invention.

FIG. 8 shows the construction of a planar-emission type laser diode 50 according to a third embodiment of the present invention, wherein those parts corresponding to the parts described previously are designated by the same reference numerals and the description thereof will be omitted.

In the laser diode 50, the electrode 32 has a ring-shaped form and exposes the GaAs cap layer 30 at the central part thereof, wherein the exposed part of the cap layer 30 is covered by an anti-reflection film AR. Further, the waveguide layer 24 and the waveguide layer 28 are replaced respectively by layers 24' and 28' each including an alternate stacking of GaAs and AlGaAs. Thereby, the layers 24' and 28' act as a mirror and a vertical optical cavity is formed between the layers 24' and 28'. Generally, the number of the stacked layers is set smaller in the layer 28' as compared with the layer 24'.

In such a construction, it should be noted that the optical beam produced by the vertically aligned quantum dots 26b is amplified as it is reflected back and forth in the vertical optical cavity thus formed, and the optical beam thus amplified is emitted from the upper major surface of the cap layer 30, on which the anti-reflection film AR is provided, in the form of a coherent optical beam.

[FOURTH EMBODIMENT]

Figure 9:
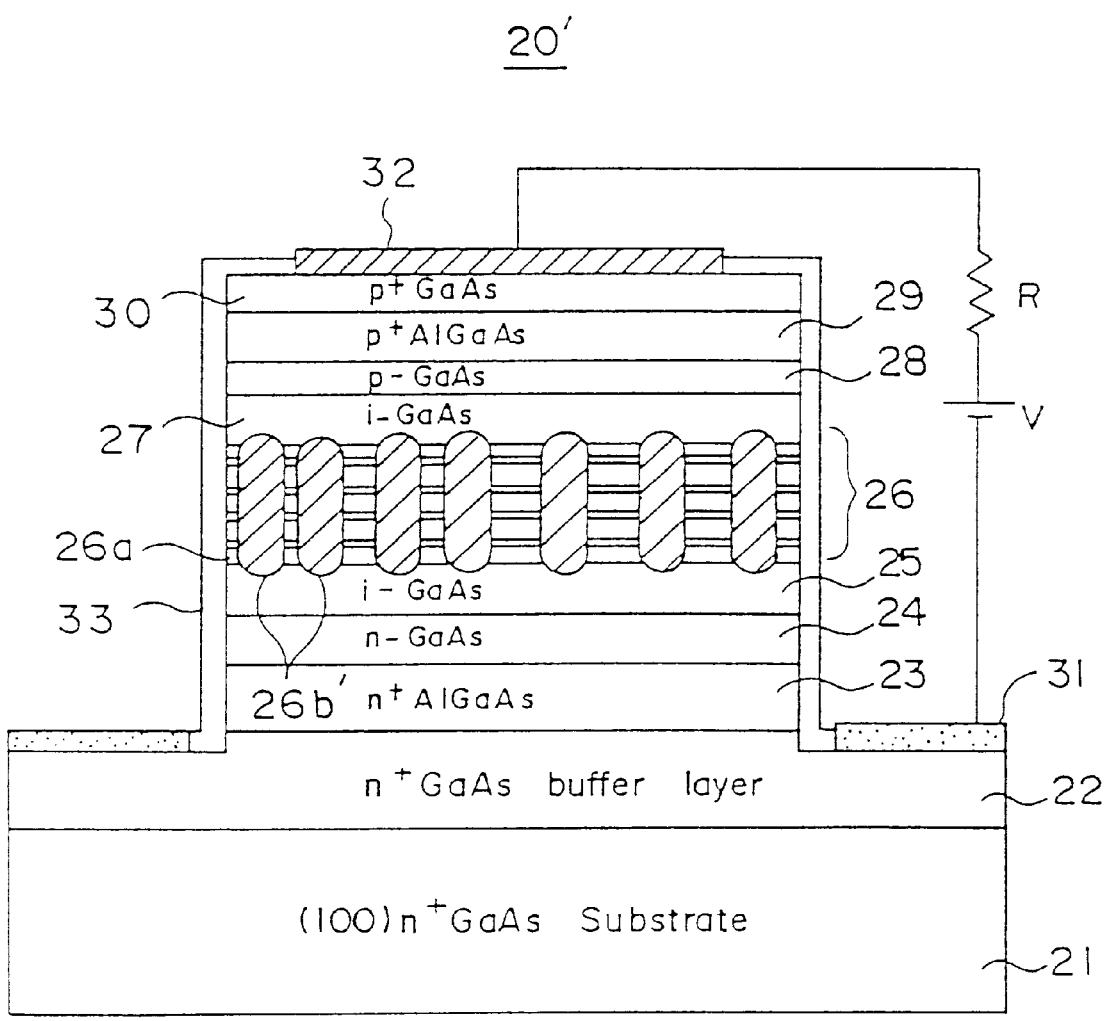
FIG. 9 is a diagram showing the construction of a light emitting diode according to a fourth embodiment of the present invention.

In each of the foregoing embodiments, it should be noted that the quantum structure may be applied with an annealing process such that the vertically aligned quantum dots are merged with each other as indicated in FIG. 9.

FIG. 9 shows an example of a light-emitting diode 20' in which such an annealing is applied to the structure of FIG. 6, wherein those parts corresponding to the parts described previously are designated by the same reference numerals.

Referring to FIG. 9, it should be noted that the vertically aligned quantum dots 26b of FIG. 6 are now merged with each other as a result of the annealing process to form a physically single quantum dot 26b'. In such a structure, it is expected that the sharpness of the resonant energy spectrum becomes further improved. It should be noted that such an annealing may be contacted at 800° C. for 1 minute.

In the embodiments described heretofore, the quantum dots are formed by the islands of InNAs formed on a GaAs layer. However, the present invention is by no means limited to such a specific combination of the materials but is applicable to any combination of semiconductor materials that form a strained heteroepitaxial system.

For example, the intermediate layer 26a of GaAs of FIG. 9 may be replaced by InGaAs, GaInP or AlGaAs and the quantum dots 26b may be formed of GaInNAs Further, in each of the embodiments described heretofore, it is preferable to set the composition of the intermediate layers such that the lattice misfit between the intermediate layer and the substrate is smaller than about 7%.

Further, the present invention is not limited to the embodiments described heretofore, but various variations and modifications may be made without departing from the scope of the invention.

The present application is based on Japanese priority application No.10-066899 filed on Mar. 17, 1998, the entire contents of which are hereby incorporated by reference.

What is claimed is:

1. A quantum semiconductor device, comprising:

a semiconductor substrate;

an active layer formed on said semiconductor substrate and including a quantum structure, said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each said quantum dots in an intermediate layer having a height substantially identical with a thickness of said intermediate layer;

said quantum dot in an intermediate layer aligning with another quantum dot in an adjacent intermediate layer in a direction perpendicular to a principal surface of said semiconductor substrate;

each of said plurality of intermediate layers having a thickness equal to or smaller than a Bohr-radius of carriers in said intermediate layer, wherein each of said plurality of quantum dots has a composition represented as $InN_xAs_{1-x}$, with a compositional parameter x not exceeding 0.04.

2. A quantum semiconductor device as claimed in claim 1, wherein each of said plurality of intermediate layers has a thickness smaller than a height of said quantum dots in a freely grown state.

3. A quantum semiconductor device as claimed in claim 1, wherein said aligned quantum dots form a quantum mechanical coupling with each other to form an effectively single quantum dot interacting with a radiation having a wavelength of a 1.3 $\mu$m band.

4. A quantum semiconductor device as claimed in claim 1, wherein each of said plurality of quantum dots is formed of InNAs, and wherein each of said plurality of intermediate layers is formed of GaAs.

5. A quantum semiconductor device as claimed in claim 1, wherein each of said plurality of quantum dots has a composition represented as $InN_xAs_{1-x}$, with a compositional parameter x in a range of 0.02 to 0.04.

6. A quantum semiconductor device, comprising:

a semiconductor substrate;

an active layer formed on said semiconductor substrate and including a quantum structure, said quantum structure comprising:

an intermediate layer formed of a first semiconductor crystal having a first lattice constant;

said intermediate layer including a plurality of quantum dots of a second semiconductor crystal having a second lattice constant different from said first lattice constant, said second semiconductor crystal forming thereby a strained system with respect to said first semiconductor crystal, each of said quantum dots having a height substantially identical with a thickness of said intermediate layer;

said intermediate layer having a thickness equal to or smaller than a Bohr-radius of carriers in said intermediate layer, wherein each of said plurality of quantum dots has a composition represented as $InN_xAs_{1-x}$, with a compositional parameter x not exceeding 0.04.

7. An optical semiconductor device, comprising:

a semiconductor substrate;

a first cladding layer provided on said semiconductor substrate;

an active layer provided on said first cladding layer and including a quantum structure;

a second cladding layer provided on said active layer;

a first electrode provided on said semiconductor substrate for injecting carriers of a first type into said active layer via said first cladding layer;

a second electrode provided on said second cladding layer for injecting carriers of a second type into said active layer via said second cladding layer;

said quantum structure comprising:

a plurality of intermediate layers stacked on each other repeatedly, each of said plurality of intermediate layers being formed of a first semiconductor crystal having a first lattice constant;

each of said intermediate layers including a plurality of quantum dots of a second semiconductor crystal having a second lattice constant different from said first lattice constant, said second semiconductor crystal forming thereby a strained system with respect to said first semiconductor crystal, each of said quantum dots in an intermediate layer having a height substantially identical with a thickness of said intermediate layer;

a quantum dot in an intermediate layer aligning with another quantum dot in an adjacent intermediate layer in a direction perpendicular to a principle surface of said semiconductor substrate;

each of said plurality of intermediate layers having a thickness equal to or smaller than a Bohr-radius of carriers in said intermediate layer, wherein each of said plurality of quantum dots has a composition represented as $InN_xAs_{1-x}$, with a compositional parameter x not exceeding 0.04.

8. An optical semiconductor device as claimed in claim 7, wherein each of said plurality of intermediate layers has a thickness smaller than a height of said quantum dots in a freely grown state.

9. An optical semiconductor device as claimed in claim 7, wherein said aligned quantum dots form a quantum mechanical coupling with each other to form an effectively single quantum dot interacting with a radiation having a wavelength of a 1.3 μm band.

10. An optical semiconductor device as claimed in claim 7, wherein each of said plurality of quantum dots is formed of InNAs, and wherein each of said plurality of intermediate layers is formed of GaAs.

11. An optical semiconductor device as claimed in claim 7, wherein each of said plurality of quantum dots has a composition represented as $InN_xAs_{1-x}$, with a compositional parameter x in a range of 0.02 to 0.04.

12. An optical semiconductor device, comprising:

a semiconductor substrate;

a first cladding layer provided on said semiconductor substrate;

an active layer provided on said first cladding layer and including a quantum structure;

a second cladding layer provided on said active layer;

a first electrode provided on said semiconductor substrate for injecting carriers of a first type into said active layer via said first cladding layer;

a second electrode provided on said second cladding layer for injecting carriers of a second type into said active layer via said second cladding layer;

said quantum structure comprising:

an intermediate layer formed of a first semiconductor crystal having a first lattice constant;

said intermediate layer including a plurality of quantum dots of a second semiconductor crystal having a second lattice constant different from said first lattice constant, said second semiconductor crystal forming thereby a strained system with respect to said first semiconductor crystal, each of said quantum dots having a height substantially identical with a thickness of said intermediate layer;

said intermediate layers having a thickness equal to or smaller than a Bohr-radius of carriers in said intermediate layer, wherein each of said plurality of quantum dots has a composition represented as $InN_xAs_{1-x}$, with a compositional parameter x not exceeding 0.04.

13. A quantum semiconductor device as claimed in claim 1, wherein each of said plurality of intermediate layers has a thickness of 0.4 to 0.6 times smaller than a height of said quantum dots in a freely grown state.

14. An optical semiconductor device as claimed in claim 7, wherein each of said plurality of intermediate layers has a thickness of 0.4 to 0.6 times smaller than a height of said quantum dots in a freely grown state.

15. An optical semiconductor device as claimed in claim 12, wherein said second semiconductor crystal contains N at an amount of less than 4 atomic %.

16. An optical semiconductor device as claimed in claim 12, wherein said second semiconductor crystal contains N at an amount of 2 to 3 atomic %.

17. A quantum semiconductor device, comprising:

a semiconductor substrate; and an active layer formed on said semiconductor substrate and including a quantum structure, said quantum structure having a photo luminescence at a wavelength equal to or greater than 1.3 μm and including a plurality of intermediate layers stacked on each other repeatedly, each of said plurality of intermediate layers being formed of a first semiconductor crystal having a first lattice constant, each of said intermediate layers including a plurality of quantum dots of a second semiconductor crystal having a second lattice constant different from said first lattice constant and forming a strained system with respect to said first semiconductor crystal, and said quantum dots in each of said intermediate layers aligning with the quantum dots in an adjacent intermediate layer perpendicular to a principal surface of said semiconductor substrate, wherein each of said plurality of quantum dots has a composition represented as $InN_xAs_{1-x}$, with a compositional parameter x not exceeding 0.04.

18. A quantum semiconductor device as claimed in claim 17, wherein each of said plurality of quantum dots has a composition represented as $InN_xAs_{1-x}$, with a compositional parameter x in a range of 0.02 to 0.04.

* * * * *